(12) United States Patent
Chen et al.

(10) Patent No.: US 11,645,568 B2
(45) Date of Patent: May 9, 2023

(54) TECHNIQUES FOR CONTROLLING SMALL ANGLE MøLMER-SøRENSEN GATES AND FOR HANDLING ASYMMETRIC SPAM ERRORS

(71) Applicant: IonQ, Inc., College Park, MD (US)

(72) Inventors: Jwo-Sy Chen, Greenbelt, MD (US); Neal Pisenti, Laurel, MD (US); Yunseong Nam, North Bethesda, MD (US)

(73) Assignee: IONQ, INC., College Park, MD (US)

( * ) Notice: Subject to any disclaimer, the term of this patent is extended or adjusted under 35 U.S.C. 154(b) by 654 days.

(21) Appl. No.: 16/708,207

(22) Filed: Dec. 9, 2019

(65) Prior Publication Data

US 2020/0242502 A1    Jul. 30, 2020

Related U.S. Application Data

(60) Provisional application No. 62/797,014, filed on Jan. 25, 2019.

(51) Int. Cl.
*G06N 10/00* (2022.01)
*G06F 30/20* (2020.01)
*G06F 11/10* (2006.01)

(52) U.S. Cl.
CPC ......... *G06N 10/00* (2019.01); *G06F 11/1004* (2013.01); *G06F 30/20* (2020.01)

(58) Field of Classification Search
CPC ...... G06N 10/00; G06F 11/1004; G06F 30/20
USPC .......................................................... 703/19
See application file for complete search history.

(56) References Cited

U.S. PATENT DOCUMENTS

| | | | |
|---|---|---|---|
| 10,846,366 B1 * | 11/2020 | Otterbach | G06F 17/17 |
| 2018/0365585 A1 * | 12/2018 | Smith | G06F 9/5027 |
| 2019/0095811 A1 * | 3/2019 | Antonio | G06N 10/00 |

* cited by examiner

*Primary Examiner* — James C Kerveros
(74) *Attorney, Agent, or Firm* — Arentfox Schiff LLP

(57) ABSTRACT

The disclosure describes various techniques to control of small angle Mølmer-Sørensen (MS) gates and to handle asymmetric errors. A technique is described that implements a two-qubit calibration circuit with two MS gates, where a parameter θ represents an amount of entanglement of the MS gate. The calibration circuit is run for several values of θ to measure observed parity signals that are direct measurements of the values of θ. Calibration information is generated that describes the relationship between θ and the parity signals, and such calibration information is then provided to arbitrarily calibrate one or more MS gates in a quantum simulation. Another technique is described for using the calibration information in quantum simulations, including for quantum chemistry simulations. Yet another technique is described for handling system-based asymmetric errors in the measurements of different qubit states in different types of quantum circuits, including, for example, the calibration circuit mentioned above.

27 Claims, 8 Drawing Sheets

TECHNIQUES FOR CONTROLLING SMALL ANGLE MøLMER-SøRENSEN GATES AND FOR HANDLING ASYMMETRIC SPAM ERRORS

CROSS REFERENCE TO RELATED APPLICATION

The present application claims priority to and the benefit from U.S. Provisional Patent Application No. 62/797,014, entitled "TECHNIQUES FOR CONTROLLING SMALL ANGLE MØLMER-SØRENSEN GATES AND FOR HANDLING ASYMMETRIC SPAM ERRORS," and filed on Jan. 25, 2019, the contents of which are incorporated herein by reference in their entirety.

BACKGROUND OF THE DISCLOSURE

Aspects of the present disclosure generally relate to quantum circuit constructions, and more specifically, to techniques for control of small angle Mølmer-Sørensen (MS) gates and for handling asymmetric state-preparation-and-measurement (SPAM) errors in quantum circuit optimization.

Trapped atomic ions and superconducting circuits are two examples of quantum information processing (QIP) approaches that have delivered small yet already universal and fully programmable machines. In a trapped ion QIP, there exists a native two-qubit entangling protocol, such as MS gates. The ability to control the degree of entanglement of the MS gates under partially entangling conditions benefits quantum circuit optimization for applications such as quantum chemistry computation, including those computations that use a variable quantum eigensolver (VQE) approach. This control requires careful calibration between the degree of entanglement and the optical or radio frequency (RF) power used in connection with the MS gate. To date most calibration schemes rely on the extrapolation from a full entanglement condition or other indirect measurements, which are time consuming and require additional efforts to handle the systematic errors of experimental instruments. A new method or technique that can be used to measure and calibrate the degree of entanglement of MS gates without the drawbacks mentioned above is highly desirable.

Moreover, when the QIP system has SPAM errors between the two qubit states, circuit implementation techniques that makes the computation results less susceptible to such errors in the QIP system are also desirable. In some instances, such techniques may be used in connection with the measurement and calibration of the degree of entanglement of MS gates.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, a method for calibrating quantum gates is described that includes implementing, in a QIP system, a two-qubit calibration circuit, the calibration circuit including a first Mølmer-Sørensen (MS) gate, MS($\theta$) gate, and a second MS gate, MS($-\theta$) gate, where $\theta$ represents an amount of entanglement of the MS gates; running the calibration circuit in the QIP system for a range of values of $\theta$; measuring observed parity signals resulting from running the calibration circuit, the two-qubit calibration circuit being configured such that each of the observed parity signals is a direct measurement of a different value of $\theta$; generating calibration information that describes the relationship between the values of $\theta$ in the range and their corresponding calibration observable measurements; and providing the calibration information to arbitrarily calibrate one or more MS gates in a quantum simulation.

In an aspect of the disclosure, another method for calibrating quantum gates is described that includes receiving calibration information that describes a relationship between parity signals and respective values of $\theta$ within a range for MS gates, where $\theta$ represents an amount of entanglement of the MS gates; applying optical or RF power to an MS calibration circuit for a target value of $\theta$; measuring a parity signal from running the MS calibration circuit to determine if the corresponding value of $\theta$ in the calibration information is the target value of $\theta$; in response to the corresponding value of $\theta$ being the target value of $\theta$, completing the calibration and enabling the MS gate for use in a quantum simulation; and in response to the corresponding small value of $\theta$ not being the target value of $\theta$, adjusting the optical or RF power being applied to the MS gates in the MS calibration circuit until the measured parity signal corresponds to the target value of $\theta$ for completing the calibration and enabling the MS gate for use in a quantum simulation.

In another aspect of the disclosure, a QIP system for calibrating quantum gates is described that includes a calibration component configured to control one or more components of the QIP system for: implementing a two-qubit calibration circuit, the calibration circuit including a first MS gate, MS($\theta$) gate, and a second MS gate, MS($-\theta$) gate, where $\theta$ represents an amount of entanglement of the MS gates; running the calibration circuit for a range of values of $\theta$; measuring observed parity signals resulting from running the calibration circuit, the two-qubit calibration circuit being configured such that each of the observed parity signals is a direct measurement of a different value of $\theta$; and generating calibration information that describes the relationship between the values of $\theta$ in the range and their corresponding calibration observable measurements. The QIP system may also include a memory for storing the calibration information, wherein the calibration component is configured to access the calibration information in the memory to provide the calibration information to the one or more components of the QIP system to arbitrarily calibrate one or more MS gates in a quantum simulation. The one or more components of the QIP system may include one or more of a trap (e.g., an atom or ion trp), an optical controller, an algorithms component, or any of their sub-components.

In another aspect of the disclosure, a QIP system for calibrating quantum gates is described that includes a memory storing calibration information that describes a relationship between parity signals and respective values of $\theta$ within a range for MS gates, where $\theta$ represents an amount of entanglement of the MS gates; and a calibration component configured to control one or more components of the QIP system for: receiving the calibration information; applying optical or RF power to an MS calibration circuit for a target value of $\theta$; measuring a parity signal from running the MS calibration circuit to determine if the corresponding value of in the calibration information is the target value of $\theta$; in response to the corresponding value of $\theta$ being the target value of θ, completing the calibration and enabling the MS gate for use in a quantum simulation; and in response to the corresponding value of θ not being the target value of θ, adjusting the optical or RF power being applied to the MS gates in the MS calibration circuit until the measured parity signal corresponds to the target value of θ for completing the calibration and enabling the MS gate for use in a quantum simulation. The one or more components of the QIP system may include one or more of a trap (e.g., an atom or ion trap), an optical controller, an algorithms component, or any of their sub-components.

In another aspect of the disclosure, a method for handling asymmetric SPAM errors in QIP systems is described that includes implementing a quantum circuit in the QIP system, where the quantum circuit has at least a first qubit line and a second qubit line, a first qubit state in the QIP system has a greater measurement error than a second qubit state in the QIP system, swapping the role of the first qubit state and the second qubit state at a quantum circuit level in response to the first qubit line and/or the second qubit line being expected to be at the first qubit state at measurement, and enabling a quantum simulation using the quantum circuit with the first qubit state and the second qubit state reassigned in the first qubit line and/or the second qubit line after the swapping of their roles.

In another aspect of the disclosure a QIP system for handling asymmetric SPAM errors is described that includes an asymmetric error component configured to control one or more components of the QIP system for: implementing a quantum circuit in the QIP system, wherein the quantum circuit has at least a first qubit line and a second qubit line, and a first qubit state in the QIP system has a greater measurement error than a second qubit state in the QIP system; swapping the role of the first qubit state and the second qubit state at a quantum circuit level in response to the first qubit line and/or the second qubit line being expected to be at the first qubit state at measurement; and performing a quantum simulation using the quantum circuit with the first qubit state and the second qubit state reassigned in the first qubit line and/or the second qubit line after the swapping of their roles. The one or more components of the QIP system may include one or more of a trap (e.g., an atom or ion trap), an optical controller, an algorithms component, or any of their sub-components.

Described herein are methods and systems for various aspects associated with techniques for control of small angle Mølmer-Sørensen (MS) gates and for handling asymmetric SPAM errors. At least some aspects of these methods and systems may be implemented in a computer-readable storage medium having computer-executable code that when executed performs the various functions of these methods and systems.

BRIEF DESCRIPTION OF THE DRAWINGS

The appended drawings illustrate only some implementation and are therefore not to be considered limiting of scope.

DETAILED DESCRIPTION

Figure 1:
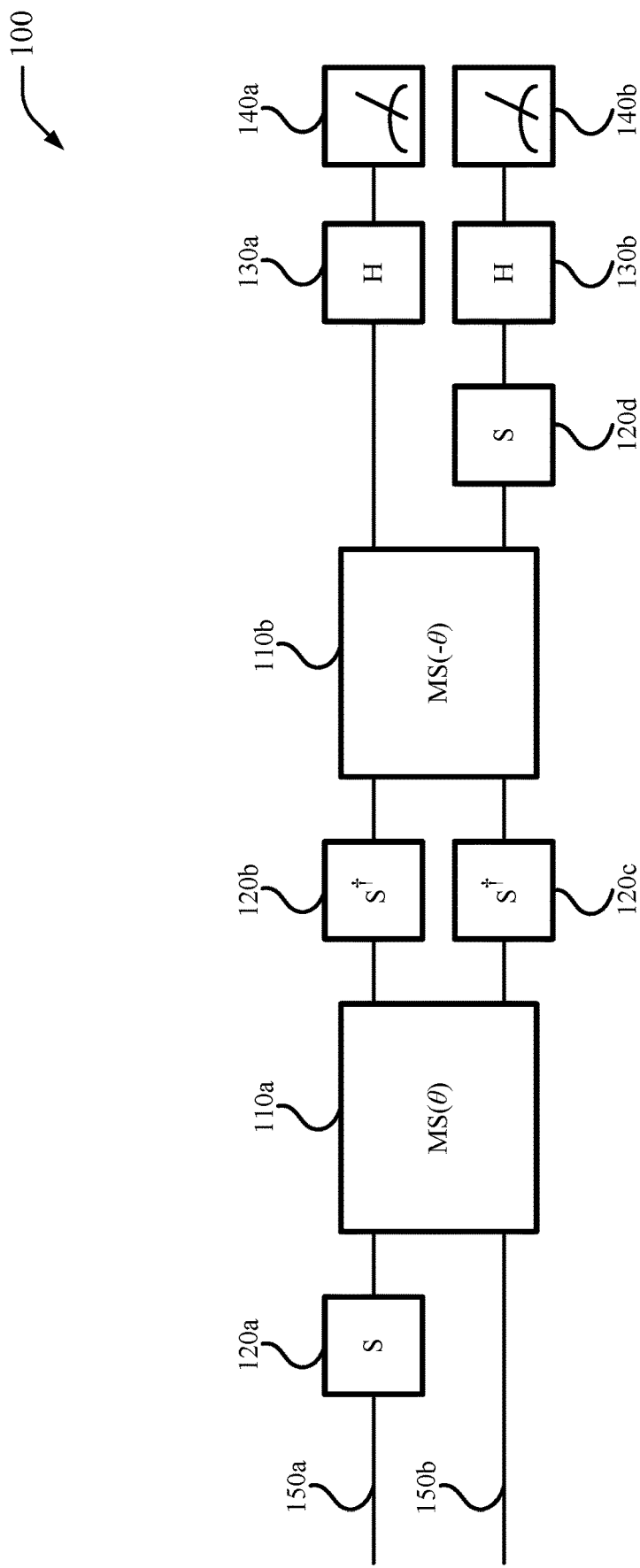
FIG. 1 is a diagram that illustrates an example of a two-qubit calibration circuit in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, trapped atomic ions and superconducting circuits are two examples of QIP approaches that have delivered small yet already universal and fully programmable machines. In trapped ion QIP, interactions may be naturally realized as extensions of common two-qubit gate interactions. Therefore, it is desirable to use entangling gates for efficient (e.g., reduced gate count) quantum circuit constructions to implement interactions in trapped ion technology. One particular interaction available in the use of trapped ions for quantum computing is the so-called Mølmer-Sørensen (MS) gate, also known as the XX coupling or Ising gate. To achieve computational universality, the Mølmer-Sørensen gate (either locally addressable or globally addressable) is complemented by arbitrary single-qubit operations.

In this disclosure, a two-qubit quantum circuit to calibrate the MS gates is proposed. The parity signal of a two-ion pair is measured as the feature of the entanglement of the MS gate. This provides a model-independent method to measure and calibrate MS gates at an arbitrary angle with the higher accuracy than the traditional methods. In addition this method can be integrated in a quantum system to actively control and to feedback the degree of entanglement.

Traditionally the calibration of small angle MS gates is implemented in two ways. The first method is measuring the number of gates required to achieve the full entanglement. The second method relies on separate experiments that calibrate the radio-frequency or optical power applied to the qubit.

In the first traditional calibration method, it only applies to the situations when the full entanglement angle, π/2, is a multiple of a degree of entanglement (θ) of interest. For any other angles, an extrapolation operation is required and the calibration becomes fit model-dependent. Moreover when the θ is small, many MS gates are required to reach full entanglement such that other incoherence and experimental imperfections are likely to affect the quality of the calibration.

In the second traditional calibration method, even though it can apply to arbitrary angles, it does not actually calibrate the degree of entanglement directly but, instead, it calibrates other physical quantities, and propagates the results to the operation of MS gates. Accordingly, the imperfections that occur in the propagation process are not included in the measurement (calibration) process.

The techniques proposed in this disclosure may be used to measure and calibrate any arbitrary angles with only two MS gates. Therefore it is less sensitive to other experimental shortcomings. Moreover since the entanglement quantity is measured directly, these techniques can be implemented in a closed-loop feedback control system to actively servo (e.g., dynamically control) the degree of entanglement of one or more MS gates.

In a similar spirit to calibrating the system that enhances the performance of the quantum computer, another consideration is the asymmetric error rates that occur when measuring $|0\rangle$ and $|1\rangle$ qubit states to improve the quality of the computational results. Consider, for instance, a case where a qubit line is expected to be in the $|1\rangle$ qubit state at measurement and the $|1\rangle$ qubit state had greater measurement errors than the $|0\rangle$ qubit state. In this case, it may be best to redefine or reassign the representations or conditions of the $|0\rangle$ and $|1\rangle$ qubit states. This approach may end up modifying the circuit but the computation performed is equivalent and the measurement errors are reduced.

Additional details of both the calibration of MS gates and the handling of asymmetric measurement errors are provided below.

As mentioned above, traditionally when thinking about quantum computing a set of universal gates are considered that include or involve some arbitrary single-qubit gates and also at least one two-qubit gate such as a controlled-NOT gate. The controlled-NOT gate has two (2) input qubits and one of them is flipped based on the state of the other. The Mølmer-Sørensen or MS gate is a similar gate having two input qubits, where if you input $|00\rangle$ the output of the MS gate is $(|00\rangle+|11\rangle)/\sqrt{2}$ if the MS gate parameter is set to is fully entangle the two qubits. Accordingly, the MS gate is typically characterized for its fully entanglement setting.

It turns out, however, that when the power or intensity of the laser or laser sources applied to the MS gate is reduced or turned down, instead of the output of the MS gate being $(|00\rangle+|11\rangle)/\sqrt{2}$, the output of the MS gate can be $$\cos\frac{\theta}{2}|00\rangle + \sin\frac{\theta}{2}|11\rangle,$$

which means that for small $\theta$ (e.g., a small amount or degree of entanglement), the output of the MS gate can be approximately $|00\rangle$ with a small fraction of $|11\rangle$ added in. These are clearly more complicated gates than the fully entangling MS gate and may not be best for use as universal gates, however, these types of MS gates are very useful in certain types of problems, including in the simulation or solution of quantum chemistry problems. The use of small-angle MS gates can also be very useful in quantum approximate optimization algorithms and quantum machine learning algorithms, for example. Then the issue with these gates is how to tune the power of lasers or RF sources correctly to get the right $\theta$, that is, the right amount or degree of entanglement.

In the full entangled case, $\theta=\pi/2$ such that $$\cos\frac{\theta}{2} = \sin\frac{\theta}{2}$$

and the output of the MS gate is $(|00\rangle+|11\rangle)/\sqrt{2}$. For small values of $\theta$, the angles are arbitrary. For example, the angles can be instead $\theta=\pi/20$ or $\theta=\pi/25$, or any other small values. If the power of the optical beams or RF sources drifts higher, then the angle becomes larger and the degree of entanglement can change to an undesirable value. There needs to be an efficient and effective way to calibrate or control the laser power to get the right angle.

The calibration process can present some challenges. As described above in connection with the first traditional method, if the target angle is $\theta=\pi/20$, for example, one approach is to repeat this ten (10) times so that $\theta=\pi/20$ becomes $\theta=\pi/2=10\times\pi/20$ and get a fully entangled state. Once the fully entangled state is achieved there are standard approaches that can be taken to characterize how well has the fully entanglement been achieved, for example, by looking at the population of parities of the qubit pair and estimate how well the entangled state was created. An entanglement witness can be used to determine if there is entanglement and how well it was done (e.g., the fidelity of the operation). So this approach works when $\theta=\pi/2$ is a multiple of the desired or target angle, but does not work so well when the target angle is $\theta=\pi/13$ or $\theta=\pi/25$, for example, for which there is no multiple to get to $\theta=\pi/2$. Moreover, as described above, for any other angles for which $\theta=\pi/2$ is not a multiple of the desired or target angle, extrapolation is required and the calibration becomes fit model-dependent. When $\theta$ is small (e.g. has a small value), many MS gates are required such that other incoherence and experimental imperfection may affect the quality of the calibration.

As described above in connection with the second traditional method, another approach is to calibrate physical quantities other than the angle directly. For example, the amount of laser power on an MS gate that is needed to obtain a particular or desirable $\theta$ may be determined based on how much radio frequency (RF) power is applied to acousto-optic modulators (AOMs) in a QIP system that are used to control the power of RF sources or optical beams (e.g., the AOMs may operate as laser switches). In this approach, the envelope shape of the laser pulse applied to the MS gate is amplitude modulated (e.g., modulate the laser power) through the RF power/AOM to get a spin entanglement at the end of the MS gate and vary the amplitude of the laser pulse (e.g., vary the laser power) to control the degree of entanglement or the entangled state being created.

Therefore, if it is determined that a certain amount of RF power (and therefore a corresponding amount of laser power) is needed to get full entanglement ($\theta=\pi/2$), then the amount of RF power reduction that is needed for a smaller angle MS gate is proportional to squared root of the relative difference between the small angle and $\pi/2$. For example, if 2 Watts of power are needed for full entanglement ($\theta=\pi/2$), then to get an angle that is ten (10) times smaller ($\theta=\pi/20$), the amount of power needed has to be scaled down by a factor of $\sqrt{10}$, so that approximately 0.6 Watts are needed for $\theta=\pi/20$. It turns out, however, that AOMs and/or other laboratory instruments may have non-linear responses and such a direct scaling of physical quantities (e.g., RF and/or optical power) does not work as well as needed. Moreover, as described above, this approach does not actually calibrate the degree of entanglement directly but, instead, it calibrates other physical quantities, and propagates the results to the operation of MS gates where the imperfections happening in the propagation process is not included in the calibration process. Trying to characterize the small angle MS and calibrate the laser power can be a challenging problem.

In order to have a better measurement and calibration approach of arbitrary angle MS gates, a technique based on only two MS gates is proposed.

FIG. 1 is a diagram 100 that illustrates an example of a two-qubit calibration circuit in accordance with aspects of this disclosure. The quantum circuit in the diagram 100, also referred to as a quantum calibration circuit or simply a calibration circuit, consists of only two small angle MS gates to measure and calibrate the degree of entanglement of an MS gate, $\theta$. The quantum circuit includes an S gate 120a, a first MS gate 110a, MS($\theta$), two S$^\dagger$ gates 120b and 120c, a second MS gate 110b, MS($-\theta$), an S gate 120d, two Hadamard (H) gates 130a and 130b, and two measurements 140a and 140b. The quantum circuit has a top or first qubit line 150a and a bottom or second qubit line 150b.

The state of the two-qubit system of the quantum circuit in the diagram 100 can be represented as a 4×1 vector $$\begin{bmatrix} C_{00} \\ C_{01} \\ C_{10} \\ C_{11} \end{bmatrix}$$

the components of which represent the amplitude of quantum states $\psi = C_{00}|00\rangle + C_{01}|01\rangle + C_{10}|10\rangle + C_{11}|11\rangle$. The amplitude is a complex number, and the experimentally observed value is the absolute square (AS) of the complex amplitude. Accordingly, the application of quantum circuits can be modeled as the matrix multiplication. All the gates shown in the quantum circuit in the diagram 100 can be represented as:

$$H = \frac{1}{\sqrt{2}} \begin{bmatrix} 1 & 1 \\ 1 & -1 \end{bmatrix},$$

$$S = \begin{bmatrix} 1 & 0 \\ 0 & i \end{bmatrix}, \text{ and}$$

$$MS(\theta) = \begin{bmatrix} \cos\theta/2 & 0 & 0 & -i\sin\theta/2 \\ 0 & \cos\theta/2 & -i\sin\theta/2 & 0 \\ 0 & -i\sin\theta/2 & \cos\theta/2 & 0 \\ -i\sin\theta/2 & 0 & 0 & \cos\theta/2 \end{bmatrix}.$$

As described above, the angle $\theta$ represents the amount of the entanglement created after the MS interaction ($\theta = \pi/2$ corresponds to the full entanglement). Hence the matrix representation of the full two-qubit calibration circuit is $$\frac{1}{2} \begin{bmatrix} (\cos\theta - \sin\theta) & 1 & 1 & (\cos\theta + \sin\theta) \\ (\cos\theta + \sin\theta) & -1 & 1 & (-\cos\theta + \sin\theta) \\ (\cos\theta + \sin\theta) & 1 & -1 & (-\cos\theta + \sin\theta) \\ (\cos\theta - \sin\theta) & -1 & -1 & (\cos\theta + \sin\theta) \end{bmatrix}.$$

Note that there may be many different matrix representations of the quantum circuit presented here, and what is being shown represents one convention. Before the experiment, the two-qubit state is initialized to $|00\rangle$, or $$\begin{bmatrix} 1 \\ 0 \\ 0 \\ 0 \end{bmatrix}$$

in the matrix notation being used in this convention. The expected probability amplitude output of the circuit is $$\frac{1}{2} \begin{bmatrix} (\cos\theta - \sin\theta) \\ (\cos\theta + \sin\theta) \\ (\cos\theta + \sin\theta) \\ (\cos\theta - \sin\theta) \end{bmatrix}.$$

Therefore, the observed parity signal, defined as $$AS\left(\frac{\cos\theta - \sin\theta}{2}\right) + AS\left(\frac{\cos\theta - \sin\theta}{2}\right) - AS\left(\frac{\cos\theta + \sin\theta}{2}\right) - AS\left(\frac{\cos\theta + \sin\theta}{2}\right)$$

and is given by $P = -\sin(2\cdot\theta)$. Therefore, the two-qubit calibration circuit may be used to directly measure the angle of the MS gate. This benefits accurate implementation of quantum circuits that require a precise control of the entanglement.

Figure 2:
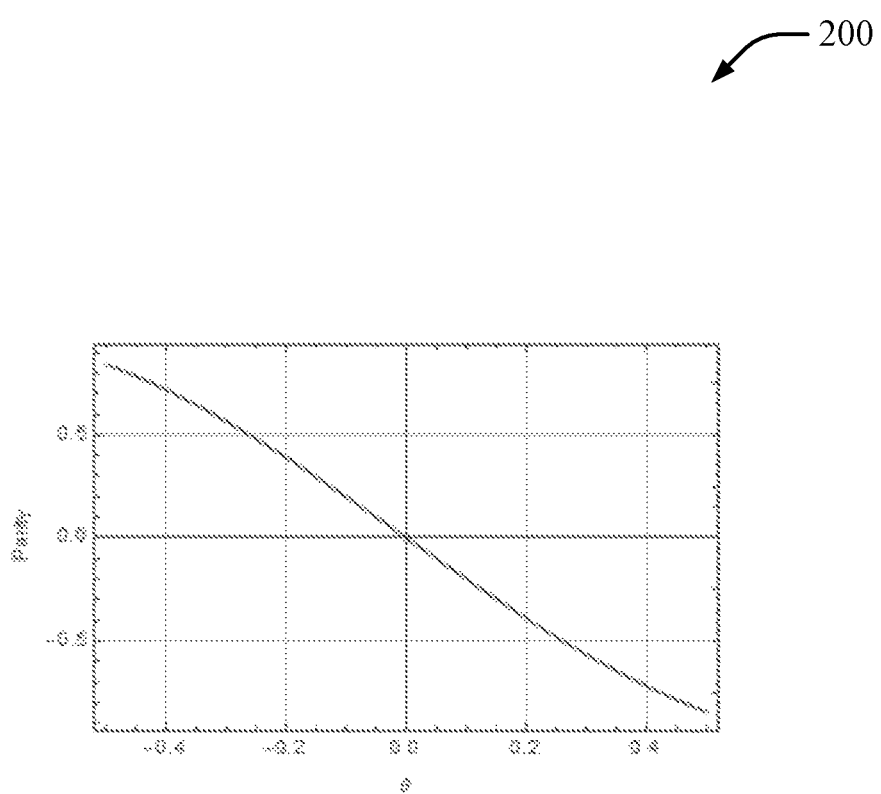
FIG. 2 is a diagram that illustrates an example of a calibration curve that provides a relationship between a degree or amount of entanglement, θ, and parity signals in accordance with aspects of this disclosure.

FIG. 2 shows a diagram 200 that illustrates an example of a calibration curve that provides a relationship between a degree or amount of entanglement, $\theta$, and parity signals in accordance with aspects of this disclosure. For example, the calibration curve shows the relationship between the expected parity signal and the degree or amount of entanglement, $\theta$. This calibration curve, which results from using the two-qubit calibration circuit described above and measuring the correlation at the output, can be stored and used to calibrate different MS gates of arbitrary angles.

The approach described in connection with FIGS. 1 and 2 provides a more practical way to calibrate the laser power (or the RF power used to control the laser power) so that it is possible to tune the MS gates to the desired degree or amount of entanglement, $\theta$. In this approach, $\theta$ is the parameter of the MS gate that can be controlled, and the parity is the population of the qubits that can be measured very accurately. One way to use the calibration information in the calibration curve generated by running the two-qubit calibration circuit is to first tune the laser power for the MS gate, measure the parity that results from the MS gate and infer the angle $\theta$ from the calibration curve. The laser power may be adjusted or tuned until the parity measurements give the desired or target angle $\theta$.

In a similar spirit to calibrating the MS gates to enhance the performance of the quantum computations or quantum simulations being performed, another consideration may be to take account for the existing of asymmetric error rates in measuring qubit states $|0\rangle$ and $|1\rangle$, and ways to improve the quality of the computational results in view of this difference. Consider, for instance, a case where a qubit line is expected to be in the $|1\rangle$ state at measurement but the measurement error of the $|1\rangle$ qubit state is greater than the measurement error of the $|0\rangle$ qubit state. In this case, it may be better to redefine or reassign the qubit state of the qubit so that the new $|0\rangle$ qubit state represents the old $|1\rangle$ qubit state and vice versa. This approach may modify the quantum circuit but the computation performed is equivalent.

That is, there may be two qubit states, $|0\rangle$ and $|1\rangle$, and the qubit state $|0\rangle$ has a smaller measurement error so it may be desirable that the output (e.g., at measurement) be $|0\rangle$ as much as possible to reduce the computational error. In a case, as described above, where the output at measurement would have been the qubit state $|1\rangle$ instead, one modification that can be made to the quantum circuit is to apply a NOT gate to the front of the qubit line where the qubit state $|1\rangle$ would appear at the output, then propagate the NOT gate to the end of the qubit line to make the output a qubit state $|0\rangle$ to avoid the higher measurement error of the qubit state $|1\rangle$, and do the $|0\rangle$ to $|1\rangle$ qubit flip as part of the process.

One example where such a technique may be applied is in quantum chemistry simulations. For example, there may be a simulation (e.g., a simulation using a quantum circuit) where there are two qubits, one associated with a top or first qubit line of a quantum circuit and another associated with a bottom or second qubit line of the quantum circuit. The top qubit may represent a top orbital (e.g., an electron orbital in an atom or molecule) and the bottom qubit may represent a bottom orbital. An electron can be either in the top orbital or the bottom orbital. One simple representation of such as system may have the qubit state $|1\rangle$ represent the electron being in the orbital and the qubit state $|0\rangle$ represent the electron not being in the orbital.

Such a two-qubit quantum chemistry circuit may be initially prepared to have $|0\rangle$ in the top qubit line and $|0\rangle$ in the bottom qubit line. To represent that there is an electron on the top qubit line, the qubit state in the top qubit line is changed to a $|1\rangle$. Accordingly, the system is initialized to say that the electron is in the top orbital (i.e., the top qubit line) and not in the bottom orbital (i.e., the bottom qubit line). The quantum chemistry circuit can be run and measurements can be made. However, the QIP system on which the quantum chemistry circuit is run can have asymmetric state preparation and measurement (SPAM) errors such that qubit states $|0\rangle$ have small errors and qubit states $|1\rangle$ have large errors (the opposite may also be the case).

Because the qubit state $|1\rangle$ can be on the top qubit line for the most part throughout the entire simulation, it will likely incur larger measurement errors. To avoid this issue, the proposed technique involves changing the representation (e.g., reassign) of having an electron in the top orbital to be the qubit state $|0\rangle$ instead since such a representation is arbitrary anyway. Now, for the top qubit line, having an electron in the top orbital is represented by the qubit state $|0\rangle$ and not having an electron in the top orbital is represented by the qubit state $|1\rangle$. For the bottom qubit line the representation remains as before, with having an electron in the bottom orbital being represented by the qubit state $|1\rangle$ and not having an electron in the bottom orbital being represented by the qubit state $|0\rangle$. The quantum chemistry circuit can be run and measurements made. If the top qubit line/top orbital results in a $|0\rangle$ then the electron is there, and if results in a $|1\rangle$ then the electron is not there. For the bottom qubit line/bottom orbital, if a $|0\rangle$ results then the electron is not there, and if a $|1\rangle$ results then the electron is there. These results can be interpreted in the opposite way classically.

The technique described above may apply to different types of quantum circuits and not just quantum chemistry circuits used in quantum chemistry simulations. By changing the designation or representation of conditions to the qubit states it is possible to reduce SPAM errors associated with those qubit states that are more susceptible to errors and reduce the error of the entire quantum circuit. This technique may be applicable to calibration circuits such as the two-qubit calibration circuit described in connection with the diagram 100 in FIG. 1.

Figure 3:
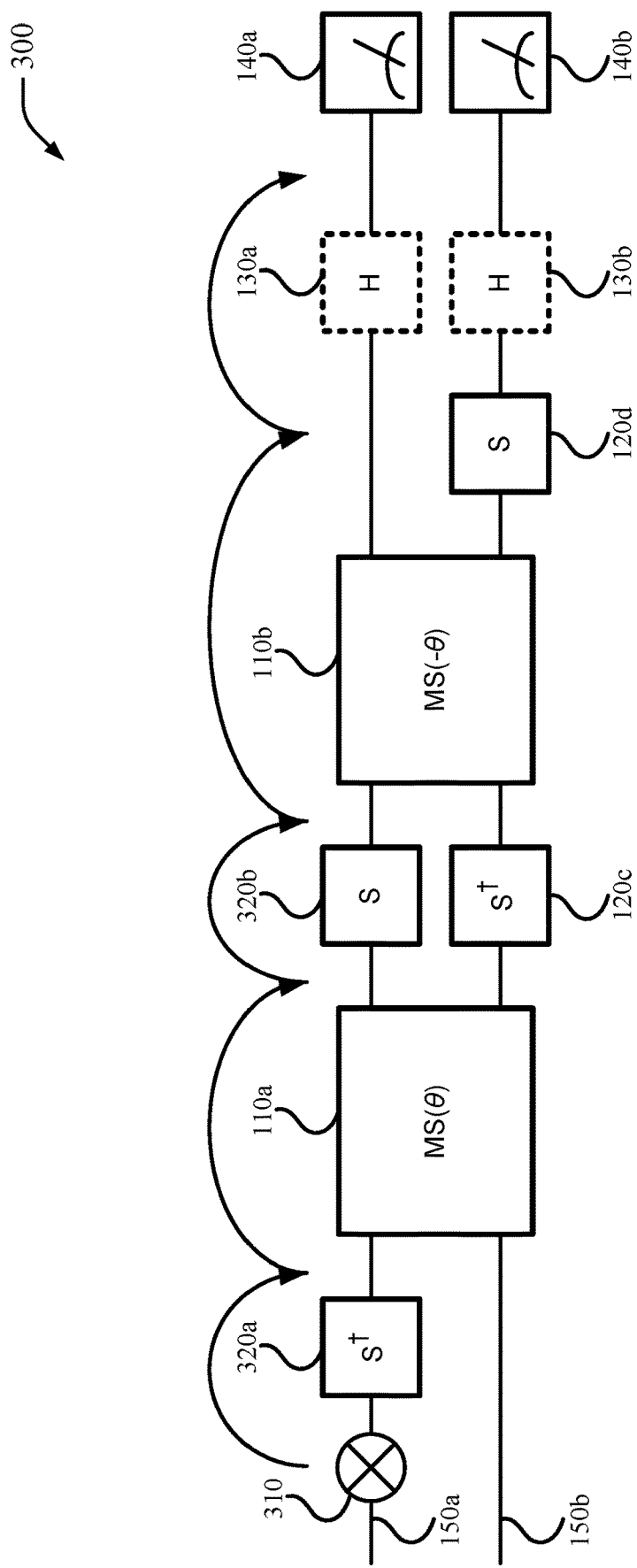
FIG. 3 is a diagram that illustrates another example of a two-qubit calibration circuit with a NOT gate in accordance with aspects of this disclosure.

For example, FIG. 3 illustrates a diagram 300 in which a similar circuit to the two-qubit calibration circuit from FIG. 1 is augmented with a NOT gate 310 on, say, the beginning of the top qubit line 150*a*. Moreover, gates 120*a* and 120*b* are replaced by gates 320*a* and 320*b* respectively, and the gates H 130*a* and H 130*b* are optional (dotted lines) and kept if the circuit is used as an MS calibration circuit. To apply the technique described above of redefining or reassigning the qubit states for handling cases where there are asymmetric SPAM errors in the system, the NOT gate 310 may be propagated through the top qubit line 150*a* to the end of the top qubit line 150*a* before the measurement 140*a*. This may be accomplished by employing certain rules, some of which are described below:

(1) a NOT gate followed by an Rz(Ø) gate is equivalent to an Rz(-Ø) gate followed by the NOT gate (NOT-Rz(Ø)= Rz(-Ø)-NOT), where the Rz(Ø) gate is a single-qubit Z-rotation by angle Ø, (2) a NOT gate followed by an MS gate, MS(θ) gate, is equivalent to an MS(θ) gate followed by the NOT gate (NOT-MS(θ)=MS(θ)-NOT), where MS(θ) gate is a continuous-parameter MS gate, and (3) a NOT gate followed by a Hadamard gate, H gate, is equivalent to an H gate followed by a Z gate (NOT-H=H-Z), where a Z gate is described as $$Z = \begin{bmatrix} 1 & 0 \\ 0 & -1 \end{bmatrix}.$$

With these rules, it is possible to propagate the initial NOT gate to the end of the circuit. Doing so reduces the error in the computation due to the measurement, since the qubit is now expected to be mostly in the lower error qubit state (e.g., in the qubit state $|0\rangle$ when that is the state that produces the smallest errors).

There are two different cases to consider once the NOT gate is propagated to the end of the quantum circuit, either the qubit line ends with a NOT gate or with a Z gate (see e.g., rule (3) above). For this situation, the following additional rules may be used:

(1) a NOT gate followed by a measurement at the end of the quantum circuit is equivalent to a measurement followed by a "classical flip," and (2) a Z gate followed by a measurement at the end of the quantum circuit is equivalent to a measurement.

In this instance, a "classical flip" means that, if we measure $|0\rangle$, we interpret it as $|1\rangle$ and vice versa. The Z gate followed by a measurement is no different from the measurement since adding a -1 phase to a $|1\rangle$ state does not alter the measurement probability.

As mentioned above, the technique described herein for handling asymmetric errors in measurement may be applied to any quantum circuit, that is, this technique may be hardware agnostic. This is because, in principle, it is generally possible to come up with appropriate commutation rules for any native gateset applicable for any hardware. This means that, whenever it is the case that we know that a qubit line is expected to be mostly in the higher measurement error state (e.g., the qubit state $|1\rangle$ in the examples provided above), the quantum computer fidelity may be improved by redefining or reassigning the representation of the qubit states.

Figure 4A:
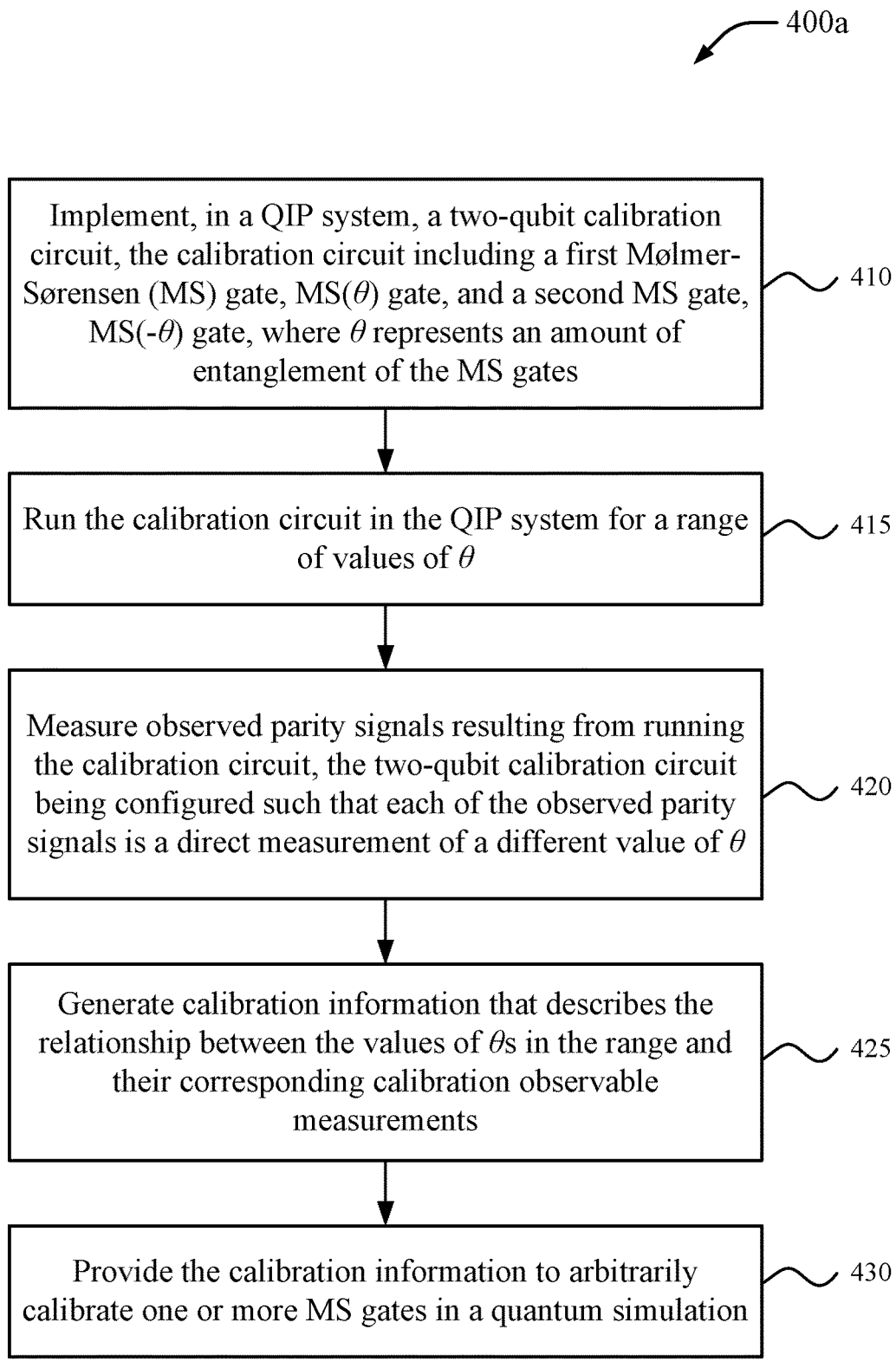
FIG. 4A is a flow chart that illustrates a method to obtain calibration information for small angle MS gates in accordance with aspects of this disclosure.

FIG. 4A is a flow chart that illustrates a method 400a to obtain calibration information for small angle MS gates in accordance with aspects of this disclosure. In an aspect, the method 400a may be performed in a computer system such as a computer system 600 described below in connection with FIG. 6, where, for example, the processor 610, the memory 620, the data store 640, and/or the operating system 660 may be used to perform the functions of the method 400a. In another aspect, the method 400a may be performed by a QIP system such as the QIP system 705 described below in connection with FIG. 7, where, for example, a calibration component 780 and/or a calibration table 785 may be used to perform the functions of the method 400a.

At 410, the method 400a may include implementing, in a QIP system, a two-qubit calibration circuit, the calibration circuit including a first MS gate, MS($\theta$) gate, and a second MS gate, MS($-\theta$) gate, where $\theta$ represents an amount of entanglement of the MS gates.

At 415, the method 400a may include running the calibration circuit in the QIP system for a range of values of $\theta$.

At 420, the method 400a may include measuring observed parity signals resulting from running the calibration circuit, the two-qubit calibration circuit being configured such that each of the observed parity signals is a direct measurement of a different value of $\theta$.

At 425, the method 400a may include generating calibration information that describes the relationship between the values of $\theta$ in the range and their corresponding calibration observable measurements.

At 430, the method 400a may include providing the calibration information to arbitrarily calibrate one or more MS gates in a quantum simulation.

In an aspect of the method 400a, the method may further include initializing the two-qubit calibration circuit to $|00\rangle$.

In another aspect of the method 400a, $\theta = \pi/2$ may represent full entanglement and the values of $\theta$ are those for which $|\theta| \ll \pi/2$.

In another aspect of the method 400a, the range of values of $\theta$ includes values of $\theta$ between $\theta = -0.5 \pi$ and $\theta = 0.5 \pi$ (in radians).

In another aspect of the method 400a, the range of values of $\theta$ includes arbitrary values of $\theta$ within that range.

In another aspect of the method 400a, the two-qubit calibration circuit is configured to produce an expected output of $$\frac{1}{2}\begin{bmatrix} (\cos\theta - \sin\theta) \\ (\cos\theta + \sin\theta) \\ (\cos\theta + \sin\theta) \\ (\cos\theta - \sin\theta) \end{bmatrix}$$

such that the observed parity signal $P = -\sin(2 \cdot \theta)$ for a particular $\theta$ is obtained from the expected probability amplitude output.

In another aspect of the method 400a, the two-qubit calibration circuit has a top qubit line and a bottom qubit line, the method 400a further including applying a NOT operation to the top qubit line such that the observed parity signal $P = \sin(2 \cdot \theta)$ for a particular $\theta$ is obtained from the expected output.

In another aspect of the method 400a, implementing the two-qubit calibration circuit having the first MS gate and the second MS gate includes implementing the two-qubit calibration circuit described in the diagram 100 in FIG. 1.

In another aspect of the method 400a, running the calibration circuit for a range of small values of $\theta$ includes varying optical or RF power applied to the two-qubit calibration circuit to produce the observed parity signals.

In another aspect of the method 400a, implementing the two-qubit calibration circuit in the QIP system includes implementing the two-qubit calibration circuit using atoms or ions in a trap of the QIP system (see e.g., ion trap 770 in QIP system 705).

In another aspect of the method 400a, the values of $\theta$ includes small values of $\theta$.

In yet another aspect of the method 400a, generating the calibration information includes generating a table with the calibration information, and providing the calibration information includes providing the table.

As described above, the method 400a may be performed in connection with a QIP system configured for calibrating quantum gates, where such QIP system may include a calibration component configured to control one or more components of the QIP system for implementing a two-qubit calibration circuit, the calibration circuit including a first MS gate, MS($\theta$) gate, and a second MS gate, MS($-\theta$) gate, where $\theta$ represents an amount of entanglement of the MS gates; for running the calibration circuit for a range of values of $\theta$; for measuring observed parity signals resulting from running the calibration circuit, the two-qubit calibration circuit being configured such that each of the observed parity signals is a direct measurement of a different value of $\theta$; and for generating calibration information that describes the relationship between the values of $\theta$ in the range and their corresponding calibration observable measurements. The QIP system may further include a memory (e.g., in the calibration component or separate from the calibration component) for storing the calibration information, wherein the calibration component is configured to access the calibration information in the memory to provide the calibration information to the one or more components of the QIP system to arbitrarily calibrate one or more MS gates in a quantum simulation. The one or more components of the QIP system may include one or more of a trap, an optical controller, an algorithms component, or any of their sub-components (see e.g., QIP system 705).

Figure 4B:
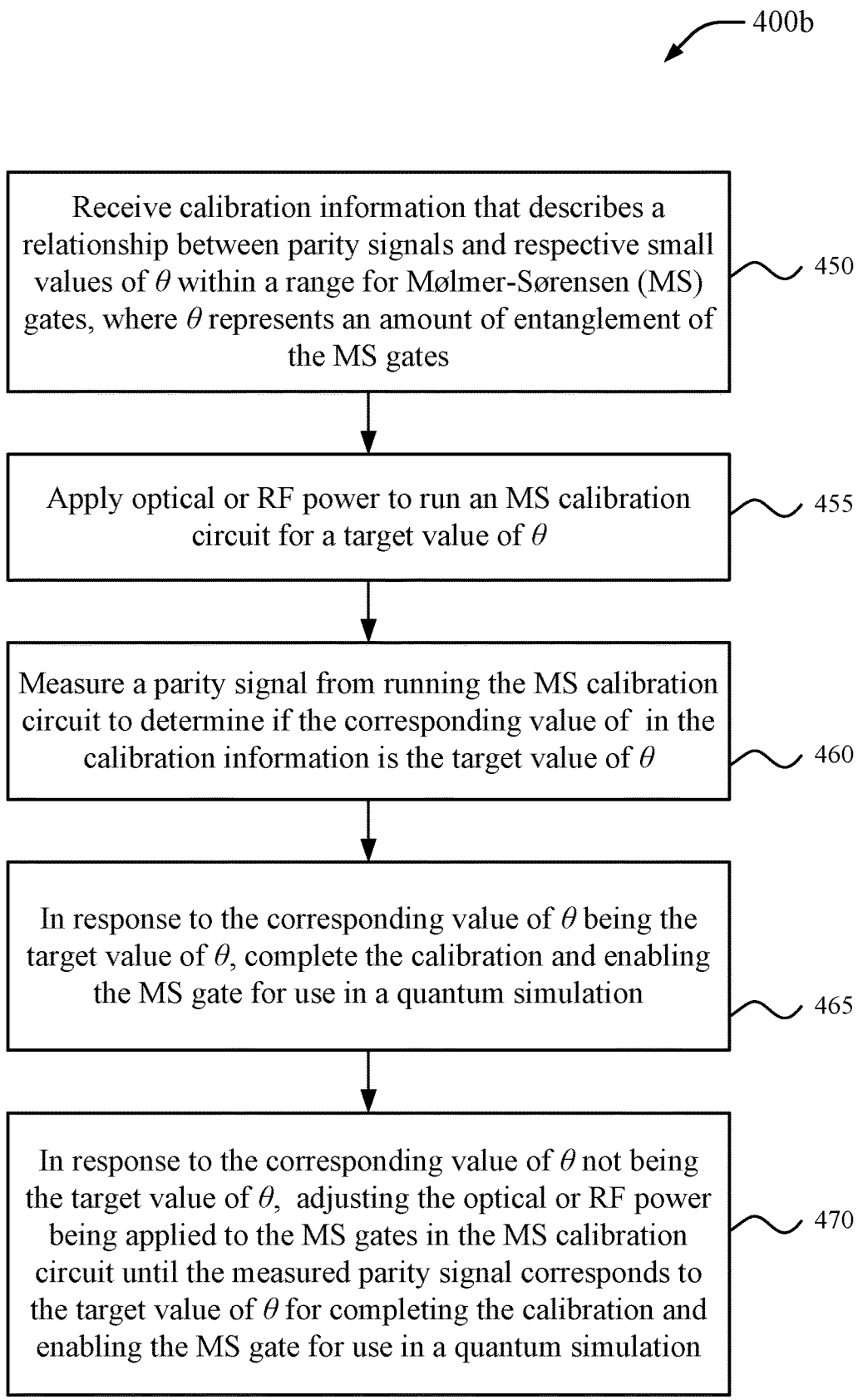
FIG. 4B is a flow chart that illustrates a method for calibrating small angle MS gates in accordance with aspects of this disclosure.

FIG. 4B is a flow chart that illustrates a method 400b for calibrating small angle MS gates in accordance with aspects of this disclosure. In an aspect, the method 400b may be performed in a computer system such as a computer system 600 described below in connection with FIG. 6, where, for example, the processor 610, the memory 620, the data store 640, and/or the operating system 660 may be used to perform the functions of the method 400b. In another aspect, the method 400b may be performed by a QIP system such as the QIP system 705 described below in connection with FIG. 7, where, for example, an calibration component 780 and/or a calibration table 785 may be used to perform the functions of the method 400b.

At 450, the method 400b may include receiving calibration information that describes a relationship between parity signals and respective small values of $\theta$ within a range for MS gates, where $\theta$ represents an amount of entanglement of the MS gates.

At 455, the method 400b may include applying an optical beam to an MS calibration circuit (e.g., the two-qubit calibration circuit in the diagram 100 in FIG. 1) for a target value of $\theta$.

At 460, the method 400*b* may include measuring a parity signal from running the MS calibration circuit to determine if the corresponding value of θ in the calibration information is the target value of θ.

At 465, the method 400*b* may include in response to the corresponding value of θ being the target value of θ, completing the calibration and enabling the MS gate for use in a quantum simulation.

At 470, the method 400*b* may include in response to the corresponding value of θ not being the target value of θ, adjusting optical or RF power being applied to the MS gates in the MS calibration circuit until the measured parity signal corresponds to the target value of θ for completing the calibration and enabling the MS gate for use in a quantum simulation.

In an aspect of the method 400*b*, the method 400*b* may further include performing the quantum simulation using the calibrated MS gate. The quantum simulation may be a quantum chemistry simulation. The quantum simulation may be a quantum approximate optimization algorithm or a quantum machine learning algorithm In another aspect of the method 400*b*, the method 400*b* may further include detecting a deviation of the optical or RF power from the optimal value used to apply the MS gate, and adjusting the optical or RF power used to apply the MS gate until the measured parity signal from the MS calibration circuit again corresponds to the target small value of θ for recalibrating the MS gate. The detecting and the adjusting may be part of a closed-loop feedback control system to actively servo the amount of entanglement of the MS gate.

In another aspect of the method 400*b*, θ=π/2 may represent full entanglement and the values of θ are those for which $|\theta| \ll \pi/2$.

In another aspect of the method 400*b*, the range of values of θ includes values of θ between θ=−0.5 π and θ=0.5 π (in radians).

In another aspect of the method 400*b*, the range of values of θ includes arbitrary values of θ within that range.

In another aspect of the method 400*b*, the method 400*b* may further include applying optical or RF power to run the MS calibration circuit for a different target value of θ; measuring a parity signal from running the MS calibration circuit to determine if the corresponding value of θ in the calibration information is the different target value of θ; in response to the corresponding value of θ being the different target value of θ, completing the calibration and enabling of a different MS gate for use in the same quantum simulation as the MS gate; and in response to the corresponding value of θ not being the different target value of θ, adjusting the optical or RF power being applied to the MS gates in the MS calibration circuit until the measured parity signal corresponds to the different target value of θ for completing the calibration and enabling the of the different MS gate for use in the same quantum simulation as the MS gate.

In another aspect of the method 400*b*, the values of θ includes small values of θ.

As described above, the method 400*b* may be performed in connection with a QIP system configured for calibrating quantum gates, where such QIP system may include a memory storing calibration information that describes a relationship between parity signals and respective small values of θ within a range for MS gates, where θ represents an amount of entanglement of the MS gates. The QIP system may further include a calibration component configured to control one or more components of the QIP system for receiving the calibration information; for applying optical or RF power to run an MS calibration circuit for a target value of θ; for measuring a parity signal from running the MS calibration circuit to determine if the corresponding value of θ in the calibration information is the target value of θ; in response to the corresponding value of θ being the target value of θ, for completing the calibration and enabling the MS gate for use in a quantum simulation; and in response to the corresponding value of θ not being the target value of θ, for adjusting the optical or RF power being applied to the MS gates in the MS calibration circuit until the measured parity signal corresponds to the target value of θ for completing the calibration and enabling the MS gate for use in a quantum simulation. The memory may be in the calibration component or separate from the calibration component. The one or more components of the QIP system may include one or more of a trap, an optical controller, an algorithms component, or any of their sub-components (see e.g., QIP system 705).

Figure 5:
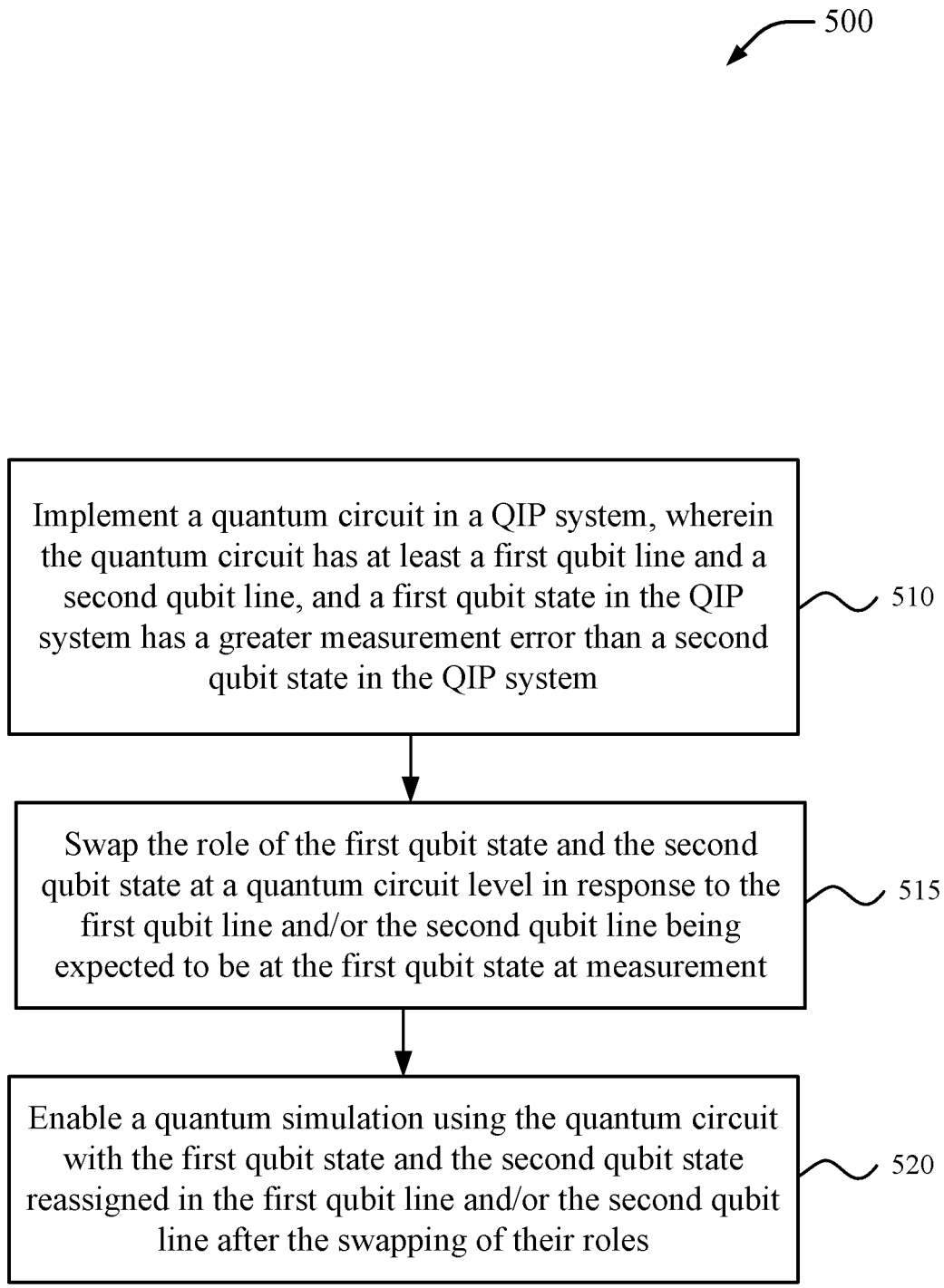
FIG. 5 is a flow chart that illustrates a method for handling asymmetric errors in accordance with aspects of this disclosure.

FIG. 5 is a flow chart that illustrates a method 500 for handling asymmetric errors in accordance with aspects of this disclosure. In an aspect, the method 500 may be performed in a computer system such as a computer system 600 described below in connection with FIG. 6, where, for example, the processor 610, the memory 620, the data store 640, and/or the operating system 660 may be used to perform the functions of the method 500. In another aspect, the method 500 may be performed by a QIP system such as the QIP system 705 described below in connection with FIG. 7, where, for example, an asymmetric error component 790 may be used to perform the functions of the method 500.

At 510, the method 500 may include implementing a quantum circuit in the QIP system, where the quantum circuit has at least a first qubit line and a second qubit line, a first qubit state in the QIP system has a greater measurement error than a second qubit state in the QIP system.

At 515, the method 500 may include swapping the role of the first qubit state and the second qubit state at a quantum circuit level in response to the first qubit line and/or the second qubit line being expected to be at the first qubit state at measurement.

At 520, the method 500 may include enabling a quantum simulation using the quantum circuit with the first qubit state and the second qubit state reassigned in the first qubit line and/or the second qubit line after the swapping of their roles.

In an aspect of the method 500, the quantum circuit is part of a quantum chemistry circuit and the quantum simulation is a quantum chemistry simulation. The method 500 further includes performing the quantum chemistry simulation using the quantum chemistry circuit with the reassigned first qubit state and second qubit state for the qubit line(s). Prior to the reassignment, the first qubit state indicates that an electron is in an orbital and the second qubit states indicates that there is no electron in an orbital, where the first qubit line corresponds to a top orbital and the second qubit line corresponds to a bottom orbital. After the reassignment, the first qubit state indicates that there is no electron in an orbital and the second qubit state indicates that there is an electron in an orbital.

In another aspect of the method 500, implementing the quantum circuit includes applying a NOT gate to a start of the first qubit line to implement the aforementioned reassignment of the first qubit state for the first qubit line. Equivalently, the NOT gate can be appropriately propagated from the start of the first qubit line to an end of the first qubit line. Propagating the NOT gate to the end of the first qubit line is performed based on one or more rules in connection with one or more gates in the quantum circuit, the one or more rules including: the NOT gate followed by an Rz(θ)

gate is equivalent to an Rz(−θ) gate followed by the NOT gate (NOT-Rz(≥)=Rz(−θ)-NOT), the NOT gate followed by an MS gate, MS(θ) gate, is equivalent to an MS(θ) gate followed by the NOT gate (NOT-MS(θ)=MS(θ)-NOT), where MS(θ) gate is a continuous-parameter MS gate, or the NOT gate followed by a Hadamard gate, H gate, is equivalent to an H gate followed by a Z gate (NOT-H=H-Z). Moreover, propagating the NOT gate to the end of the first qubit line based on the one or more rules results in either a NOT gate or a Z gate at the end of the first qubit line, the method further comprising: in response to the first qubit line ending in the NOT gate and then a measurement being made, performing the measurement and a classical flip, or in response to the first qubit line ending in the Z gate and then a measurement being made, performing the measurement.

In another aspect of the method 500, implementing the quantum circuit in the QIP system includes implementing the quantum circuit using atoms or ions in a trap of the QIP system (see e.g., ion trap 770 in the QIP 705).

In yet another aspect of the method 500, the quantum circuit is a calibration circuit for calibrating MS gates, and the calibration circuit includes a first MS gate, MS(θ) gate, and a second MS gate, MS(−θ) gate, where θ represents an amount of entanglement of the MS gates.

As described above, the method 500 may be performed in connection with a QIP system configured for handling asymmetric errors, where such QIP system may include an asymmetric error component configured to control one or more components of the QIP system for implementing a quantum circuit in the QIP system, where the quantum circuit has at least a first qubit line and a second qubit line, and a first qubit state in the QIP system has a greater measurement error than a second qubit state in the QIP system. The asymmetric error component may also be configured for swapping the role of the first qubit state and the second qubit state at a quantum circuit level in response to the first qubit line and/or the second qubit line being expected to be at the first qubit state at measurement. The asymmetric error component may also be configured for enabling a quantum simulation using the quantum circuit with the first qubit state and the second qubit state reassigned in the first qubit line and/or the second qubit line after the swapping of their roles. The one or more components of the QIP system may include one or more of a trap, an optical controller, an algorithms component, or any of their sub-components (see e.g., QIP system 705).

Figure 6:
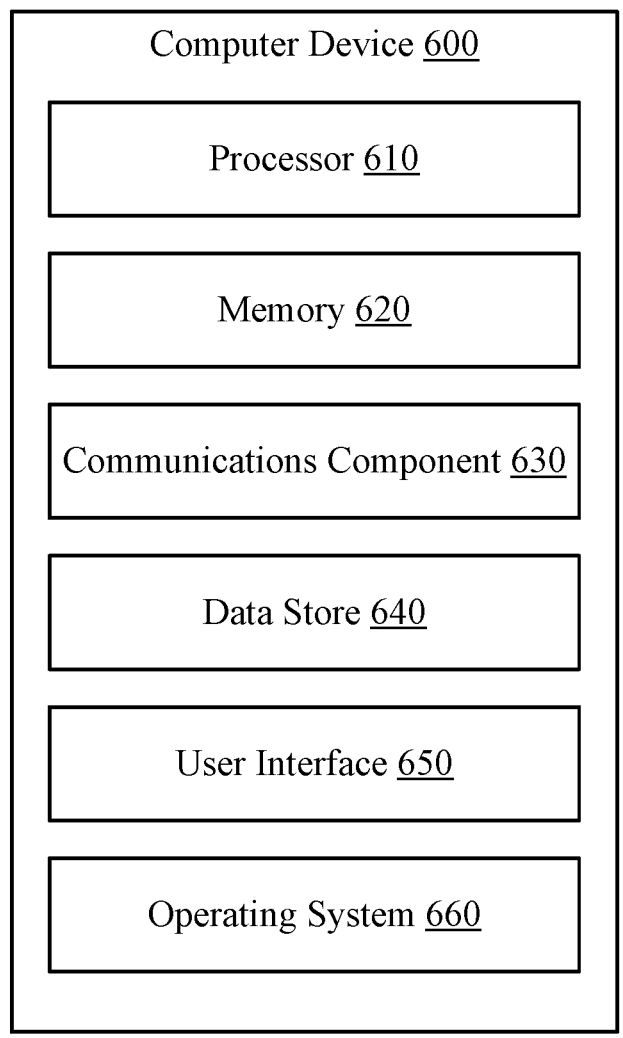
FIG. 6 is a block diagram of a computer device in accordance with aspects of this disclosure.

Referring now to FIG. 6, illustrated is an example computer device 600 in accordance with aspects of the disclosure. The computer device 600 can represent a single computing device, multiple computing devices, or a distributed computing system, for example. The computer device 600 may be configured as a quantum computer, a classical computer, or a combination of quantum and classical computing functions. For example, the computer device 600 may be used for the calibration and implementation of MS gates, and/or for handling asymmetric error measurements. Moreover, the computer device 600 may be used as a quantum computer and may implement quantum algorithms based on the techniques described herein.

In one example, the computer device 600 may include a processor 610 for carrying out processing functions or methods associated with one or more of the features described herein. The processor 610 may include a single or multiple set of processors or multi-core processors. Moreover, the processor 610 may be implemented as an integrated processing system and/or a distributed processing system. The processor 610 may include a central processing unit (CPU), a quantum processing unit (QPU), a graphics processing unit (GPU), or combination of those types of processors.

In an example, the computer device 600 may include a memory 620 for storing instructions executable by the processor 610 for carrying out the functions or methods described herein. In an implementation, for example, the memory 620 may correspond to a computer-readable storage medium that stores code or instructions to perform one or more of the functions, method, or operations described herein. In one example, the memory 620 may include instructions to perform aspects of the methods 400a, 400b, and/or 500.

Further, the computer device 600 may include a communications component 630 that provides for establishing and maintaining communications with one or more parties utilizing hardware, software, and services as described herein. The communications component 630 may carry communications between components on the computer device 600, as well as between the computer device 600 and external devices, such as devices located across a communications network and/or devices serially or locally connected to computer device 600. For example, the communications component 630 may include one or more buses, and may further include transmit chain components and receive chain components associated with a transmitter and receiver, respectively, operable for interfacing with external devices.

Additionally, the computer device 600 may include a data store 640, which can be any suitable combination of hardware and/or software, that provides for mass storage of information, databases, and programs employed in connection with implementations described herein. For example, the data store 640 may be a data repository for operating system 660 (e.g., classical OS, or quantum OS). In one implementation, the data store 640 may include the memory 620.

The computer device 600 may also include a user interface component 650 operable to receive inputs from a user of the computer device 600 and further operable to generate outputs for presentation to the user or to provide to a different system (directly or indirectly). The user interface component 650 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 650 may include one or more output devices, including but not limited to a display, a speaker, a haptic feedback mechanism, a printer, any other mechanism capable of presenting an output to a user, or any combination thereof.

In an implementation, the user interface component 650 may transmit and/or receive messages corresponding to the operation of the operating system 660. In addition, the processor 610 may execute the operating system 660 and/or applications or programs (e.g., programs to calibrate MS gates and/or for handling asymmetric error measurements), and the memory 620 or the data store 640 may store them.

When the computer device 600 is implemented as part of a cloud-based infrastructure solution, the user interface component 650 may be used to allow a user of the cloud-based infrastructure solution to remotely interact with the computer device 600.

Figure 7:
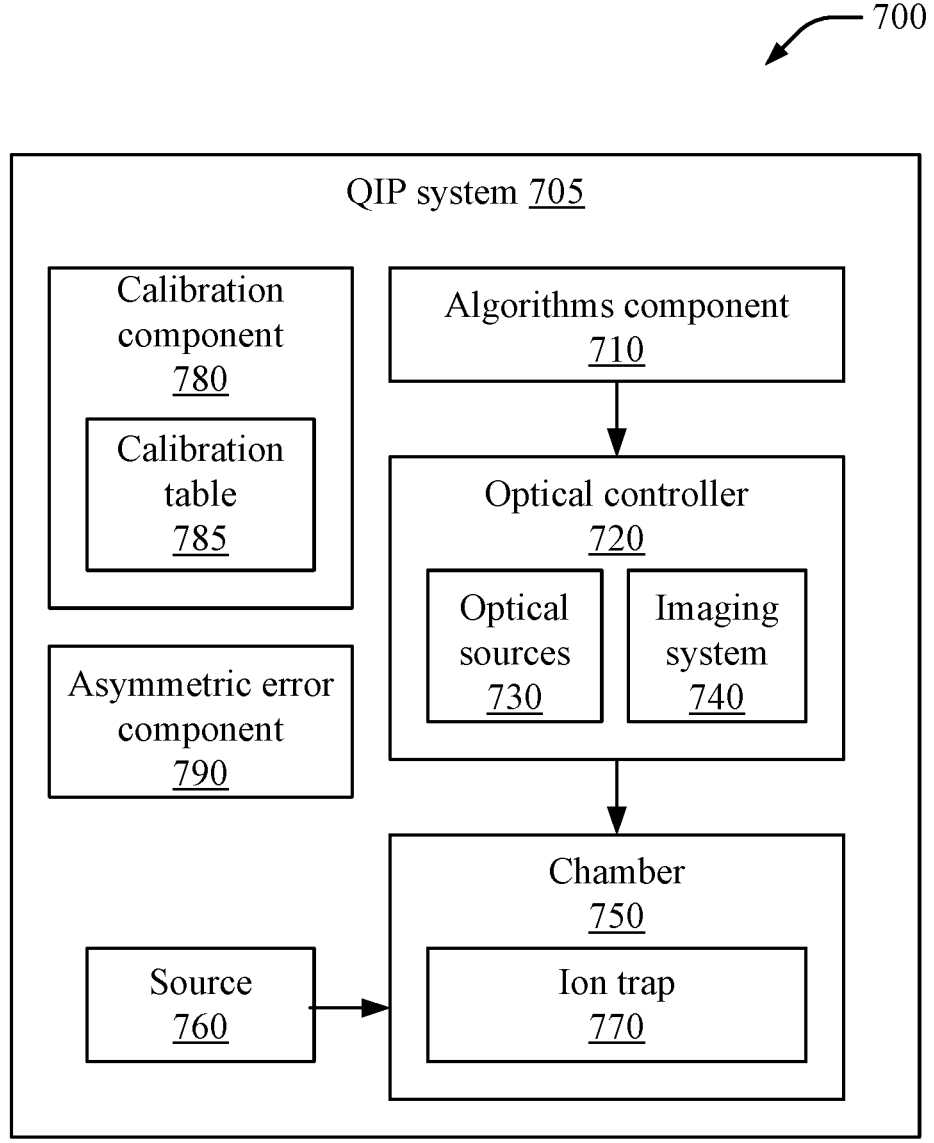
FIG. 7 is a block diagram that illustrates an example of a QIP system in accordance with aspects of this disclosure.

FIG. 7 is a block diagram that illustrates an example of a QIP system 705 in accordance with aspects of this disclosure. The QIP system 705 may also be referred to as a quantum computing system, a computer device, or the like. In an aspect, the QIP system 705 may correspond to portions of a quantum computer implementation of the computer device 600 in FIG. 6.

The QIP system 705 may include a source 760 that provides atomic species to a chamber 750 having an ion trap 770 that traps the atomic species once ionized by an optical controller 720. Optical sources 730 in the optical controller 720 may include one or more light or optical beam sources that provide laser or optical beams that can be used for ionization of the atomic species, control (e.g., phase control) of the atomic ions, for fluorescence of the atomic ions that can be monitored and tracked by image processing algorithms operating in an imaging system 740 in the optical controller 720, and/or for implementing and controlling one or more gates, including MS gates and their degree of entanglement. The imaging system 740 can include a high resolution imager (e.g., CCD camera) for monitoring the atomic ions while they are being provided to the ion trap 770 (e.g., for counting) or after they have been provided to the ion trap 770 (e.g., for monitoring the atomic ions states). In an aspect, the imaging system 740 may be implemented separate from the optical controller 720, however, the use of fluorescence to detect, identify, and label atomic ions using image processing algorithms may need to be coordinated with the optical controller 720.

The QIP system 705 may also include an algorithms component 710 that may operate with other parts of the QIP system 705 to perform quantum algorithms associated with the features described above. As such, the algorithms component 710 may provide instructions to various components of the QIP system 705 (e.g., to the optical controller 720) to enable the implementation of quantum circuits, or their equivalents, such as the ones described herein.

The QIP system 705 may also include the calibration component 780 and the calibration table 785, which may be used in connection with other parts of the QIP system 705 to perform the various features described above in connection with calibrating MS gates and using the calibrated MS gates in quantum circuits. Moreover, the QIP system 705 may further include the asymmetric error component 790, which may be used in connection with other parts of the QIP system 705 to implement the techniques described above for handling asymmetric measurement errors in the system.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for calibrating quantum gates, comprising:
   implementing, in a quantum information processing (QIP) system, a two-qubit calibration circuit, the calibration circuit including a first Mølmer-Sørensen (MS) gate, MS($\theta$) gate, and a second MS gate, MS($-\theta$) gate, where $\theta$ represents an amount of entanglement of the MS gates;
   running the calibration circuit in the QIP system for a range of values of $\theta$;
   measuring parity values resulting from running the calibration circuit, the two-qubit calibration circuit being configured such that each of the parity values is a direct measurement of a different value of $\theta$;
   generating observed parity signals based on the parity values;
   generating calibration information that describes the relationship between the values of $\theta$ in the range and corresponding calibration observable measurements; and
   providing the calibration information to arbitrarily calibrate one or more of the MS gates in a quantum simulation.

2. The method of claim 1, further comprising initializing the two-qubit calibration circuit to $|00\rangle$.

3. The method of claim 1, wherein $\theta=\pi/2$ represents full entanglement and the values of $\theta$ are those for which $|\theta|<<\pi/2$.

4. The method of claim 1, wherein the range of values of $\theta$ includes values of $\theta$ between $\theta=-0.5\,\pi$ and $\theta=0.5\,\pi$.

5. The method of claim 1, wherein the range of values of $\theta$ includes arbitrary values of $\theta$ within that range.

6. The method of claim 1, wherein the two-qubit calibration circuit is configured to produce an expected amplitude output of $$\frac{1}{2}\begin{bmatrix}(\cos\theta-\sin\theta)\\(\cos\theta+\sin\theta)\\(\cos\theta+\sin\theta)\\(\cos\theta-\sin\theta)\end{bmatrix}$$

such that the observed parity signal $P=-\sin(2\cdot\theta)$ for a particular $\theta$ is obtained from the expected output.

7. The method of claim 6, wherein the two-qubit calibration circuit has a top qubit line and a bottom qubit line, the method further including applying a NOT operation to the top qubit line such that the observed parity signal $P=\sin(2\cdot\theta)$ for a particular $\theta$ is obtained from the expected amplitude output.

8. The method of claim 1, wherein running the calibration circuit for a range of values of $\theta$ includes varying optical or radio frequency (RF) power applied to the two-qubit calibration circuit to produce the observed parity signals.

9. The method of claim 1, wherein implementing the two-qubit calibration circuit in the QIP system includes implementing the two-qubit calibration circuit using atoms or ions in a trap of the QIP system.

10. The method of claim 1, wherein:
    generating the calibration information includes generating a table with the calibration information, and
    providing the calibration information includes providing the table.

11. The method of claim 1, wherein the values of $\theta$ include small values of $\theta$.

12. The method of claim 1, wherein the two-qubit calibration circuit includes one or more of an S gate, two S+ gates, or two Hadamard gates.

13. A method for calibrating quantum gates, comprising:
    receiving calibration information that describes a relationship between parity signals and respective small values of $\theta$ within a range for Mølmer-Sørensen (MS) gates, where $\theta$ represents an amount of entanglement of the MS gates;
    applying an optical or radio frequency (RF) power to run an MS calibration circuit for a target entanglement value of $\theta$;
    measuring a parity signal from running the MS calibration circuit to determine if the corresponding value of $\theta$ in the calibration information is the target entanglement value of $\theta$;

in response to the corresponding value of θ being the target entanglement value of θ, completing the calibration and enabling the MS gate for use in a quantum simulation; and in response to the corresponding value of 0 not being the target entanglement value of θ, adjusting the optical or RF power being applied to the MS gates in the MS calibration circuit until the measured parity signal corresponds to the target entanglement value of θ for completing the calibration and enabling the MS gate for use in a quantum simulation.

14. The method of claim 13, further comprising performing the quantum simulation using the calibrated MS gate.

15. The method of claim 14, wherein the quantum simulation is a quantum chemistry simulation.

16. The method of claim 14, wherein the quantum simulation is a quantum approximate optimization algorithm or a quantum machine learning algorithm.

17. The method of claim 13, further comprising:
   detecting a deviation of the optical or RF power from an optimal value used to apply the MS gate; and
   adjusting the optical or RF power used to apply the MS gate until the measured parity signal from the MS calibration circuit again corresponds to the target small value of θ for recalibrating the MS gate.

18. The method of claim 17, wherein the detecting and the adjusting are part of a closed-loop feedback control system to actively servo the amount of entanglement of the MS gate.

19. The method of claim 13, wherein θ=π/2 represents full entanglement and the values of θ are those for which |θ|<<π/2.

20. The method of claim 13, wherein the range of values of θ includes values of θ between θ=−0.5 π and θ=0.5 π.

21. The method of claim 13, wherein the range of values of θ includes arbitrary values of θ within that range.

22. The method of claim 13, further comprising:
   applying optical or RF power to run the MS calibration circuit for a different target entanglement value of θ;
   measuring a parity signal from running the MS calibration circuit to determine if the corresponding value of θ in the calibration information is the different target entanglement value of θ;
   in response to the corresponding value of θ being the different target entanglement value of θ, completing the calibration and enabling of a different MS gate for use in the same quantum simulation as the MS gate; and
   in response to the corresponding value of θ not being the different target entanglement value of θ, adjusting the optical or RF power beam being applied to the MS gates in the MS calibration circuit until the measured parity signal corresponds to the different target entanglement value of θ for completing the calibration and enabling the different MS gate for use in the same quantum simulation as the MS gate.

23. The method of claim 13, wherein the values of θ include small values of θ.

24. A quantum information processing (QIP) system for calibrating quantum gates, comprising:
   a calibration component configured to control one or more components of the QIP system for:
      implementing a two-qubit calibration circuit, the calibration circuit including a first Mølmer-Sørensen (MS) gate, MS(θ) gate, and a second MS gate, MS(−θ) gate, where θ represents an amount of entanglement of the MS gates;
      running the calibration circuit for a range of values of θ;
      measuring parity values resulting from running the calibration circuit, the two-qubit calibration circuit being configured such that each of the parity values is a direct measurement of a different value of θ; and
      generating observed parity signals based on the parity values;
      generating calibration information that describes the relationship between the values of θ in the range and corresponding calibration observable measurements; and
   a memory for storing the calibration information, wherein the calibration component is configured to access the calibration information in the memory to provide the calibration information to the one or more components of the QIP system to arbitrarily calibrate one or more of the MS gates in a quantum simulation.

25. The QIP system of claim 24, wherein the one or more components of the QIP system include one or more of a trap, an optical controller, an algorithms component, or any of their sub-components.

26. A quantum information processing (QIP) system for calibrating quantum gates, comprising:
   a memory storing calibration information that describes a relationship between parity signals and respective small values of θ within a range for Mølmer-Sørensen (MS) gates, where θ represents an amount of entanglement of the MS gates; and
   a calibration component configured to control one or more components of the QIP system for:
      receiving the calibration information;
      applying optical or radio frequency (RF) power to run an MS calibration circuit for a target entanglement value of θ;
      measuring a parity signal from running the MS calibration circuit to determine if the corresponding value of θ in the calibration information is the target entanglement value of θ;
      in response to the corresponding value of θ being the target entanglement value of θ, completing the calibration and enabling the MS gate for use in a quantum simulation; and
      in response to the corresponding value of θ not being the target entanglement value of θ, adjusting the optical or RF power being applied to the MS gates in the MS calibration circuit until the measured parity signal corresponds to the target small value of θ for completing the calibration and enabling the MS gate for use in a quantum simulation.

27. The QIP system of claim 26, wherein the one or more components of the QIP system include one or more of a trap, an optical controller, an algorithms component, or any of their sub-components.

\* \* \* \* \*